(12) United States Patent
Takanashi et al.

(10) Patent No.: US 8,871,023 B2
(45) Date of Patent: Oct. 28, 2014

(54) SILICON SINGLE CRYSTAL PULL-UP APPARATUS AND METHOD OF MANUFACTURING SILICON SINGLE CRYSTAL

(75) Inventors: Keiichi Takanashi, Tokyo (JP); Kengo Hayashi, Tokyo (JP); Yasuhito Narushima, Tokyo (JP)

(73) Assignee: Sumco Corporation, Tokyo (JP)

(*) Notice: Subject to any disclaimer, the term of this patent is extended or adjusted under 35 U.S.C. 154(b) by 870 days.

(21) Appl. No.: 13/083,768

(22) Filed: Apr. 11, 2011

(65) Prior Publication Data

US 2011/0259260 A1 Oct. 27, 2011

(30) Foreign Application Priority Data

Apr. 26, 2010 (JP) ................................ 2010-101412

(51) Int. Cl.
| | | |
|---|---|---|
| *C30B 15/26* | (2006.01) | |
| *C30B 29/06* | (2006.01) | |
| *C30B 15/20* | (2006.01) | |
| *C30B 35/00* | (2006.01) | |

(52) U.S. Cl.
CPC ................. *C30B 29/06* (2013.01); *C30B 15/20* (2013.01); *C30B 15/26* (2013.01); *C30B 35/00* (2013.01)
USPC .................. 117/15; 117/13; 117/14; 117/217

(58) Field of Classification Search
USPC ........................................ 117/13, 14, 15, 217
See application file for complete search history.

(56) References Cited

U.S. PATENT DOCUMENTS

| 5,437,242 | A | * | 8/1995 | Hofstetter et al. | 117/14 |
|---|---|---|---|---|---|
| 7,264,674 | B2 | * | 9/2007 | Takanashi et al. | 117/15 |
| 2009/0064923 | A1 | | 3/2009 | Takanashi | |
| 2009/0293800 | A1 | * | 12/2009 | Iida et al. | 117/15 |
| 2010/0024718 | A1 | * | 2/2010 | Orschel et al. | 117/15 |
| 2010/0175611 | A1 | | 7/2010 | Takanashi | |

FOREIGN PATENT DOCUMENTS

| JP | 2000-264779 | 9/2000 |
|---|---|---|
| JP | 2001-342095 | 12/2001 |
| JP | 2007-112663 | 5/2007 |

* cited by examiner

*Primary Examiner* — Bob M Kunemund
(74) *Attorney, Agent, or Firm* — Greenblum & Bernstein, P.L.C.

(57) ABSTRACT

A silicon single crystal pull-up apparatus is provided with a chamber into which an inert gas is introduced; a crucible that supports a silicon melt within the chamber; a heater that heats the silicon melt in the crucible; a lifting device for lifting and lowering the crucible; a thermal radiation shield disposed above the crucible; a cylindrical purging tube that is provided inside the thermal radiation shield so as to straighten the inert gas; a CCD camera that photographs the mirror image of the thermal radiation shield reflected on the liquid surface of the silicon melt through the purging tube; a liquid surface level calculator that calculates the liquid surface level of the silicon melt from the position of the mirror image photographed by the camera; and a conversion table creator that creates a conversion table representing a relationship between the liquid surface level of the silicon melt and the mirror image position obtained. The liquid surface level calculator calculates the liquid surface level based on the conversion table.

8 Claims, 8 Drawing Sheets

SILICON SINGLE CRYSTAL PULL-UP APPARATUS AND METHOD OF MANUFACTURING SILICON SINGLE CRYSTAL

BACKGROUND OF THE INVENTION

1. Field of the Invention

The present invention relates to a silicon single crystal pull-up apparatus and a method of manufacturing a silicon single crystal and, more particularly, to a method of measuring and controlling a liquid surface level of silicon melt.

2. Description of Related Art

As a typical manufacturing method of a silicon single crystal for semiconductor devices, a Czochralski Method (CZ method) is known. In the CZ method, polycrystalline silicon nuggets are packed into a quartz crucible and heated by a heater for melting. Then, a seed crystal dipped into the obtained silicon melt is rotated with respect to the crucible while gradually pulling up the seed crystal to grow a silicon single crystal.

There may be a case where an impurity (dopant) such as arsenic (As) or antimony (Sb) is doped in a silicon melt for the purpose of adjusting the resistivity of the silicon single crystal in accordance with characteristics of a semiconductor device. The above dopant materials each have a low boiling point and are easily evaporated. In a typical silicon single crystal pull-up apparatus using the CZ method, a purge gas such as Ar or the like is supplied into a reduced-pressure chamber, so that As, Sb, SiO, $As_2O_3$, $Sb_2O_3$, or the like evaporated from the silicon melt is diffused and carried by the purge gas to contaminate the inside of the apparatus. Further, a thermal radiation shield provided in the chamber accelerates the flow rate of the purge gas flowing near the surface of the silicon melt, which unfavorably accelerates the evaporation of the dopant from the silicon melt.

Thus, there is considered a method of making the inside of the chamber into a high-pressure state in order to reduce the amount of evaporation of the dopant in the silicon melt. Further, there is proposed a method that makes the inside of the chamber into a high-pressure state, as well as, provides a cylindrical straightening member called "purging tube" inside the thermal radiation shield so as to straighten the purge gas introduced into the chamber by means of the purging tube (Japanese Patent Application Laid-Open (JP-A) No. 2007-112663).

A part of the dopant in the silicon melt is taken into the silicon single crystal due to segregation. Thus, the dopant concentration in the silicon melt becomes lower with the progress of a single crystal pull-up process, so that the dopant concentration in the silicon single crystal becomes lower, which makes it difficult to make constant the resistivity of the silicon single crystal in the pull-up axis direction. In order to make constant the dopant concentration, it is necessary to suppress the evaporation of the dopant in the initial stage of the pull-up process and to accelerate the evaporation of the dopant in the later stage thereof.

As a method for controlling the evaporation of the dopant, there is known a method using a purge gas introduced from the upper portion of a chamber. However, gas straightening effect produced by the thermal radiation shield is weak under the high-pressure condition as described above. Thus, in order to control the flow rate, etc., of the purge gas, precise control needs to be exercised with a distance between the thermal radiation shield and the melt liquid surface set small.

As a method of controlling the liquid surface level during the single crystal pull-up process, there are proposed various control methods, such as a method using a laser and a method using a camera (JP-A Nos. 2000-264779 and 2001-342095). For example, JP-A No. 2001-342095 discloses a method including previously calculating a conversion formula obtained by performing straight-line approximation for a relationship between the mirror image position of a reference reflector and liquid surface position, photographing the mirror image of the reference reflector reflected on the melt liquid surface by a camera in the actual measurement, calculating a correction value of the elevation speed of the crucible based on the measurement result and conversion formula, and controlling the liquid surface level based on a value obtained by adding the correction value to the crucible elevation speed.

SUMMARY OF THE INVENTION

As described above, in order to precisely control the amount of the dopant in the manufacturing process of an impurity-doped silicon single crystal, the liquid surface level of the silicon melt needs to be precisely controlled. However, in conventional silicon single crystal pull-up apparatus using the purging tube, the purging tube has a cylindrical shape, so that the image of the liquid surface captured through the purging tube is also distorted depending on the installation position, thickness, surface condition and the like of the purging tube, which makes it very difficult to precisely measure the liquid surface level based on the mirror image of the reference reflector reflected on the liquid surface.

The present invention has been made to solve the above problem, and an object thereof is to provide a silicon single crystal pull-up apparatus and a manufacturing method of a silicon single crystal capable of precisely measuring the liquid surface level even in the case where the purging tube is provided inside the thermal radiation shield to improve stability in the distribution of resistivity of the silicon single crystal in the pull-up direction.

To solve the above problem, according to one aspect of the present invention, there is provided a silicon single crystal pull-up apparatus comprising: a chamber into which an inert gas is introduced; a crucible that supports a silicon melt within the chamber; a heater that heats the silicon melt in the crucible; a lifting device for lifting and lowering the crucible; a thermal radiation shield disposed above the crucible; a purging tube that has substantially cylindrical shape and is provided inside the thermal radiation shield so as to straighten the inert gas; a camera that photographs a mirror image of the thermal radiation shield reflected on the liquid surface of the silicon melt through the purging tube; a liquid surface level calculator that calculates the liquid surface level of the silicon melt from the position of the mirror image photographed by the camera; and a conversion table creator that creates a conversion table representing a relationship between the liquid surface level of the silicon melt and the mirror image position obtained when the crucible is lifted and lowered before a start of a single crystal pull-up process to arbitrarily change the liquid surface level of the silicon melt, wherein the liquid surface level calculator calculates the liquid surface level based on the position of the mirror image photographed by the camera and the conversion table.

To solve the above problem, according to another aspect of the present invention, there is provided a method of manufacturing a silicon single crystal comprising: photographing the liquid surface of a silicon melt through a purging tube while changing the height of the crucible to obtain images, creating a conversion table representing a relationship between the position of the mirror image of a thermal radiation shield reflected on the liquid surface of the silicon melt and liquid surface level from the obtained images before start of a single crystal pull-up process; and photographing the mirror image of the thermal radiation shield reflected on the silicon melt through the purging tube, calculating the liquid surface level from the position of the mirror image using the conversion table, and controlling the height of the crucible based on the calculated liquid surface level during a single crystal pull-up process.

In the present invention, the purging tube refers to a cylindrical straightening member provided so as to surround the circumference of the pulled up silicon single crystal for the purpose of mainly straightening the flow of the purge gas introduced into the chamber. At least a part of the purging tube is made of a transparent material so as to allow the melt surface to be observed through the purging tube.

In the present invention, it is preferable that the liquid surface level calculator calculates the liquid surface level of the silicon melt from a plurality of measurement points in the mirror image photographed by the camera and that the conversion table creator creates the conversion table based on the plurality of the measurement points. With this configuration, influence of the distortion of the purging tube can be suppressed to enable more precise measurement of the liquid surface level.

In the present invention, it is preferable that the purging tube have a flat surface formed at an area including the intersection with the optical axis of the camera. With this configuration, the distortion of the purging tube can be minimized to reduce measurement error of the liquid surface level.

It is preferable that the silicon single crystal pull-up apparatus further include a controller for controlling the lifting device based on the liquid surface level calculated by the liquid surface level calculator to control the height of the crucible so as to control the liquid surface level with respect to the thermal radiation shield.

In the present invention, it is preferable that the camera photographs the mirror image in a state where the purging tube does not exist on the optical axis, and the conversion table creator creates the conversion table representing a relationship between the liquid surface level obtained when the liquid surface level of the silicon melt is arbitrarily changed while lifting and lowering the crucible before start of a single crystal pull-up process and the position of the mirror image in the state where the purging tube does not exist. With this configuration, the influence of the purging tube can be grasped more precisely, thereby reliably eliminating the influence of the purging tube included in measurement results of the liquid surface level.

In the present invention, it is preferable that the thermal radiation shield have a shield main body having a reverse conical trapezoidal shape whose diameter is increased from its lower end toward its upper end and an inside flange portion formed so as to horizontally extend from the lower end portion of the shield main body toward the inside and that the purging tube be placed on the upper surface of the inside flange portion. With this configuration, it is possible to easily set the purging tube, facilitating connection between the thermal radiation shield and the purging tube.

As described above, according to the present invention, it is possible to precisely measure the liquid surface level even in the case where the purging tube is provided inside the thermal radiation shield to improve stability in the distribution of resistivity of the silicon single crystal in the pull-up direction.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Hereinafter, preferred embodiments of the present invention will be described in detail with reference to the accompanying drawings.

Figure 1:
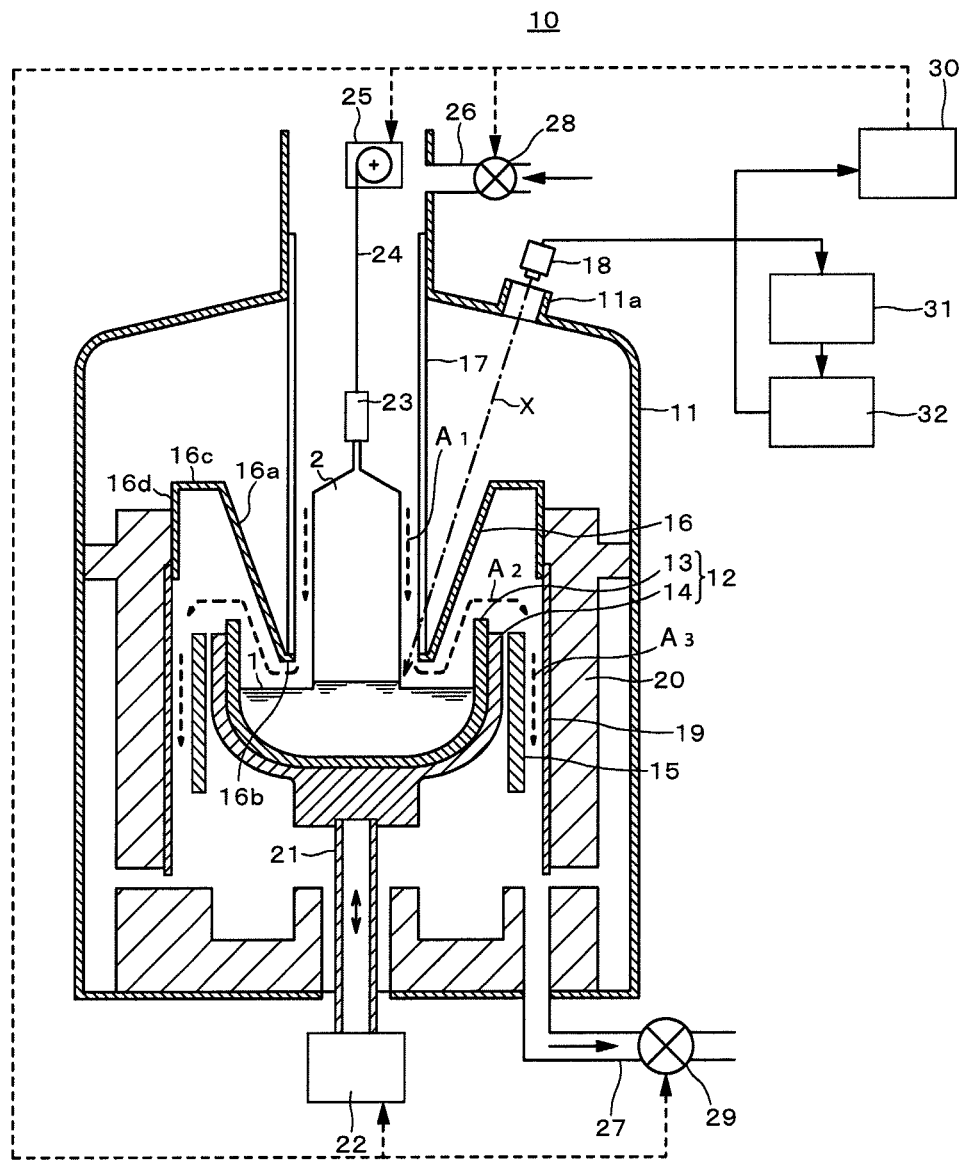
FIG. 1 is a side cross-sectional view schematically illustrating a configuration of a silicon single crystal pull-up apparatus according to a preferred embodiment of the present invention.

FIG. 1 is a side cross-sectional view schematically illustrating a configuration of a silicon single crystal pull-up apparatus according to a preferred embodiment of the present invention.

As shown in FIG. 1, a silicon single crystal pull-up apparatus 10 includes a chamber 11, a crucible 12 that supports a silicon melt 1 within the chamber 11, a heater 15 provided around the crucible 12, a thermal radiation shield 16 provided so as to prevent a silicon single crystal 2 from being heated by radiation heat from the heater 15 and crucible 12 and to suppress a temperature change of the silicon melt 1, a purging tube 17 that constitutes a guide path for the purge gas introduced into the chamber 11, a CCD camera 18 used to photograph the liquid surface of the silicon melt 1, and a controller 30 that controls the above components.

The crucible 12 is constituted by a quartz crucible 13 and a graphite susceptor 14 that supports the quartz crucible 13. The silicon melt 1 is contained in the quartz crucible 13. A cylindrical heat shield 19 is provided outside the heater 15, and a cylindrical heat insulator 20 is provided outside the heat shield 19. The crucible 12 is fixed to the upper end portion of a shaft 21 that extends in the vertical direction so as to penetrate the center of the bottom portion of the chamber 11. The shaft 21 is driven to move up and down and to rotate by a shaft drive mechanism 22. The shaft drive mechanism 22 operates according to a command from the controller 30.

Above the crucible 12, a seed chuck 23 that retains a seed crystal, a pull-up wire 24 that suspends the seed chuck 23, and a wire winding mechanism 25 for winding up the pull-up wire 24 are provided. At the time of pulling up the single crystal, the seed crystal dipped in the silicon melt 1 is gradually pulled up while rotating the crucible 12 and seed crystal in the reverse directions. The wire winding mechanism 25 operates according to a command from the controller 30.

A gas inlet port 26 is formed at the upper portion of the chamber 11, and a gas outlet port 27 is formed at the bottom portion of the chamber 11. An inert gas such as Ar is introduced into the chamber 11 through the gas inlet port 26 as a purge gas, and the flow rate thereof is controlled by a valve 28. The discharge amount of the purge gas is also controlled by a valve 29 provided in the gas outlet port 27. The operations of the valves 28 and 29 are controlled by the controller 30.

The thermal radiation shield 16 is a cylindrical member disposed above the crucible 12 and formed into a reverse conical trapezoid whose diameter is increased from its lower end toward its upper end. As a material of the thermal radiation shield 16, graphite may be used. Although details will be described later, the thermal radiation shield 16 plays a role also as a gas straightening member that straightens the flow of the purge gas near the surface of the silicon melt 1 and functions also as a part of a purge gas guide path together with the purging tube 17.

The thermal radiation shield 16 has a shield main body 16a having a reverse conical trapezoidal shape, an inside flange portion 16b formed so as to horizontally extend from the lower end portion of the shield main body 16a toward the inside of the chamber 11, and an outside flange portion 16c formed so as to horizontally extend from the upper end portion of the shield main body 16a toward the outside of the chamber 11, and an outside cylindrical portion 16d formed so as to extend downward from the outer peripheral portion of the outside flange portion 16c in the direction perpendicular to the extending direction of the outside flange portion 16c. The outside cylindrical portion 16d is fixed to the heat insulator 20. With the above structure, the gas inlet port 26 formed at the upper portion of the chamber 11, a portion near the melt surface, a space between the heater 15 and the heat shield 19, and the gas outlet port 27 are allowed to communicate with one another, whereby the purge gas introduced through the gas inlet port 26 passes through the communicating space and is then discharged through the gas outlet port 27.

The purging tube 17 is placed on a flat surface of the inside flange portion 16b of the thermal radiation shield 16. Although the purging tube 17 according to the present embodiment is formed of a single cylindrical member, it may be formed by connecting a plurality of cylindrical members. The inner diameter of the cylindrical member is larger at any point than the maximum diameter of the single crystal to be pulled up, and the value of the inner diameter can be determined in consideration of the flow straightening property of the purge gas.

The purging tube 17 is preferably made of a transparent quartz glass material so as to allow the temperature of the melt surface or growing state of the single crystal to be observed through the purging tube 17. In this case, the entire purging tube 17 may be made of the transparent quartz glass. Alternatively, a structure may be adopted in which only a part of the purging tube 17 including the intersection with the optical axis X of the CCD camera 18 is made of the transparent quartz glass and the remaining part thereof is made of opaque quartz glass.

Figure 2:
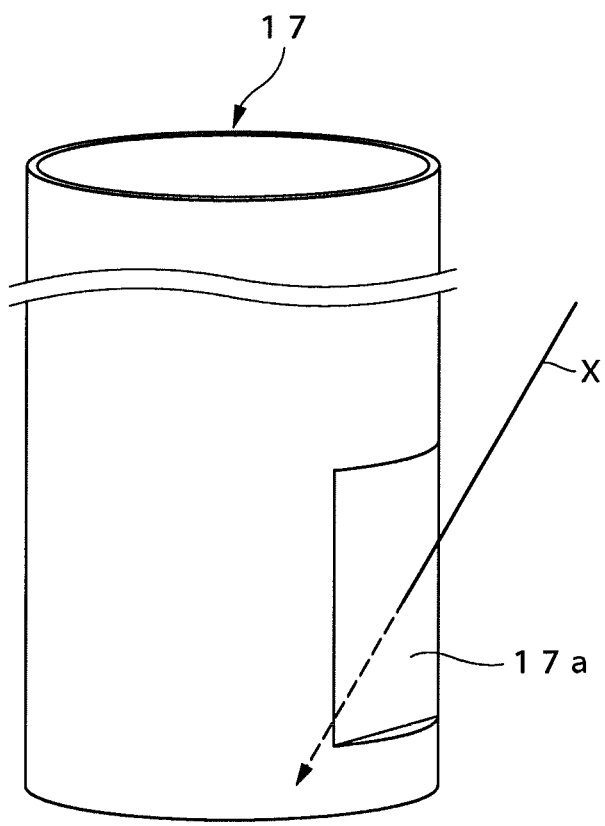
FIG. 2 is a perspective view schematically illustrating a modification of the structure of a purging tube.

FIG. 2 is a perspective view schematically illustrating a modification of the structure of the purging tube 17.

As shown in FIG. 2, the purging tube 17 according to the modification has a flat surface 17a at one portion of the outer peripheral surface thereof. The flat surface 17a is formed at an area including the intersection with the optical axis X of the CCD camera 18. In this case, the purging tube 17 may be formed by hollowing out a part of the cylindrical quartz glass material and welding a flat transparent quartz glass plate to the hollowed-out part. Alternatively, a structure may be adopted in which only the part corresponding to the flat surface 17a is made of the quartz glass and the remaining part is made of a graphite material.

The thermal radiation shield 16 and purging tube 17 constitute the purge gas guide path indicated by arrows A1 to A3, and the space within the chamber 11 is partitioned into an inner space and outer space by the purge gas guide path. The purge gas introduced into the chamber 11 through the gas inlet port 26 passes through the purging tube 17 as indicated by the arrow A1 and reaches near the surface of the silicon melt 1 without diffusing to the outer space. Subsequently, as indicated by the arrow A2, the purge gas is guided by the thermal radiation shield 16 to reach the upper portion of the side wall portion of the quartz crucible 13, then passes through a gap between the heater 15 and the heat shield 19 as indicated by the arrow A3 to reach the lower space of the chamber 11, and is finally discharged through the gas outlet port 27 formed in the bottom portion of the chamber 11. A part of the purge gas that has been guided to the lower space of the chamber 11 can diffuse to the outer space.

The shape of the purge gas guide path changes with the growth of the silicon single crystal 2 and consumption of the silicon melt 1. At the initial stage of the pull-up process, the purge gas introduced through the gas inlet port 26 passes through the wide space within the purging tube 17 and flows down near the surface of the silicon melt 1. At the stage when the single crystal has been grown to some extent, the purge gas flows through a gap between the purging tube 17 and side surfaces of the silicon single crystal 2.

An observation window 11a through which a state of the liquid surface of the silicon melt 1 is observed is disposed at the upper portion of the chamber 11. The CCD camera 18 is provided outside the observation window 11a. The CCD camera 18 photographs the liquid surface of the silicon melt 1 in the crucible 12 through the observation window 11a. The CCD camera 18 is connected to a liquid surface level calculator 31, and a photographed image is used for liquid surface level control. The CCD camera 18 may be a one-dimensional CCD camera or two-dimensional CCD camera. When the two-dimensional CCD camera is used, the liquid surface level can be calculated based on a plurality of measurement points within a two-dimensional image, thereby measuring the liquid surface level more precisely. Although a CCD camera for observing the diameter of the single crystal is provided in addition to the CCD camera 18 in the present embodiment, both the measurement of the liquid surface level and measurement of the diameter of the single crystal may be conducted only by using the CCD camera 18.

The liquid surface level of the silicon melt 1 has two meanings. One is a liquid surface level with respect to the crucible. The liquid surface level with respect to the crucible changes mainly with the consumption of the silicon melt 1 associated with the single crystal pull-up process and may change with a change in the volume of the crucible due to deformation thereof. The other is a liquid surface level with respect to the thermal radiation shield 16. The liquid surface level with respect to the thermal radiation shield 16 changes with the movement of the crucible in the up-down (vertical) direction, in addition to with the change in the liquid surface level with respect to the crucible. In the present specification, the term "liquid surface level" denotes the liquid surface level with respect to the thermal radiation shield 16 unless otherwise specified.

A conversion table creator 32 creates a conversion table representing a relationship between the position of the mirror image of the thermal radiation shield 16 reflected on the liquid surface of the silicon melt 1 and an actual liquid surface level. When the CCD camera 18 and thermal radiation shield 16 are precisely arranged at a predetermined designed position with a predetermined designed angle, it is possible to calculate the liquid surface level in a geometric-optical manner based on the mirror image position of the thermal radiation shield 16 appearing in the photographed image. Actually, however, the position and angle of the CCD camera 18 or thermal radiation shield 16 have some deviations, which may cause calculation error about the liquid surface level. Further, in the single crystal pull-up apparatus using the purging tube 17, there exists significant influence of the distortion of the purging tube 17, making it very difficult to calculate the liquid surface level in a geometric-optical manner.

As described above, the conventional liquid surface level measurement method that uses a conversion formula obtained by performing straight-line approximation for a relationship between the liquid surface level of the silicon melt 1 and the mirror image position of the thermal radiation shield 16 reflected on the liquid surface is effective in the case where the mirror image position changes linearly with respect to a change in the liquid surface level. However, in the configuration in which the purging tube exists on the light path from the CCD camera to the liquid surface of the silicon melt, an image is distorted due to a variation in the thickness of the purging tube or depending on the surface condition, so that a change in the mirror image position with respect to a change in the liquid surface level is not linear. Such a problem can occur not only when the conversion formula is a linear expression but also when the conversion formula is changed to a quadratic expression.

Thus, in the present embodiment, a conversion table representing a relationship between the mirror image position of the thermal radiation shield 16 shown in an image that has actually been photographed through the purging tube 17 and liquid surface level is previously calculated before the single crystal pull-up process and, during the single crystal pull-up process, the liquid surface level is calculated with reference to the conversion table. More specifically, after melting of a silicon raw material is completed and the silicon melt becomes stable, the crucible 12 at the initial position is raised and lowered before the single crystal pull-up process to cause the liquid surface level to change with respect to the thermal radiation shield 16. Then, a one-to-one correspondence between the mirror image position of the thermal radiation shield 16 shown in an image photographed by the CCD camera 18 and the liquid surface level at this time is calculated, and the obtained relationship is stored as the conversion table.

The liquid surface level of the silicon melt registered in the conversion table does not represent the absolute distance from the thermal radiation shield 16. The reason is as follows. That is, the initial liquid surface level of the silicon melt is set according to the following procedure: a silicon raw material in the crucible 12 is melted to obtain the silicon melt; and an operator raises and lowers the crucible while observing the liquid surface through the observation window 11a to adjust the liquid surface level to an appropriate position as the initial liquid surface level and, at this time, there is a case where a precise distance from the thermal radiation shield 16 to the initial liquid surface level is unclear. However, when the liquid surface level is caused to change based on the initial liquid surface level to thereby create the conversion table representing a relationship between the liquid surface level and mirror image position and this conversion table is used to calculate the current liquid surface level, a relative liquid surface level with respect to the initial liquid surface level can be calculated.

Figure 3:
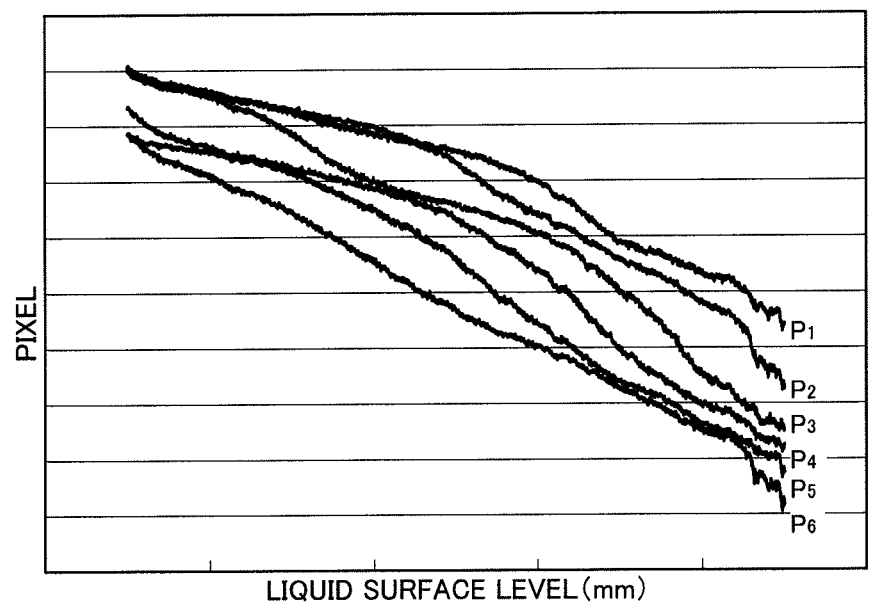
FIG. 3 is a graph illustrating a relationship between a mirror image position measured before a pull-up process and a liquid surface level.

FIG. 3 is a graph illustrating a relationship between the mirror image position measured before the pull-up process and the liquid surface level, in which the horizontal axis represents a liquid surface level (relative value), and vertical axis represents a change (pixel) of the mirror image position. Six curves $P_1$ to $P_6$ in FIG. 3 are measurement results obtained at six points selected from the mirror image of the thermal radiation shield 16 shown in an image photographed by the two-dimensional CCD camera. The respective curves represent changes in the positions of the measurement points when the liquid surface level is caused to change at a constant speed together with the crucible 12, that is, movement of the pixels corresponding to the mirror image.

As shown in FIG. 3, the relationship between the liquid surface level and pixel changes in a complicated manner at each of the six measurement points, and this indicates that the relationship between the liquid surface level and pixel is influenced by the distortion of the purging tube 17. Further, it turns out that even when the liquid surface level pixel changes due to the distortion of the purging tube 17, there exists a region in which a change in the pixel value is small. For example, the left-side parts of the data indicated by the curves $P_1$ and $P_2$ correspond to the region in which a change in the pixel value is small. In such parts, occurrence of a large variation will be caused by, e.g., fluctuation of the surface of the silicon melt 1. Since the liquid surface level is calculated at a plurality of measurement points, even when such error occurs, it is possible to solve the abovementioned problem.

Figure 4:
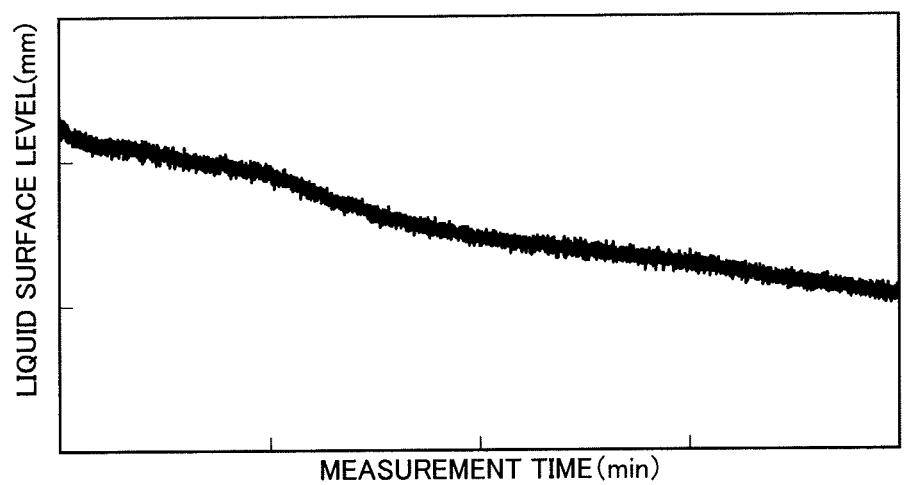
FIG. 4 is a graph illustrating a liquid surface level calculation result obtained based on measurement values at three measurement points.

FIG. 4 is a graph illustrating a liquid surface level calculation result obtained based on measurement values at three measurement points, in which the horizontal axis represents measurement time (min), and vertical axis represents a liquid surface level (relative value). In this measurement, the single crystal pull-up process is performed while intentionally controlling the position of the crucible 12 such that the liquid surface level gradually decreases with elapse of time.

As is clear from FIG. 4, when the liquid surface level is measured based on measurement values at three measurement points, the liquid surface level of the silicon melt 1 changes with elapse of time, which represents a result very similar to one obtained under the actual measurement condition. As described above, the use of the measurement values obtained at a plurality of measurement points allows the liquid surface level to be measured precisely. When the elevation speed of the crucible 12 is controlled using the result (table), the liquid surface level with respect to the thermal radiation shield 16 can be controlled, thereby ensuring an appropriate distance between the thermal radiation shield 16 and liquid surface level.

As described above, evaporated materials such as SiO and dopant oxides are continually evaporated from the surface of the silicon melt 1. Particularly, in the case of SiO which evaporates largely, in the conventional approach, the SiO is readily condensed on and adhered to the inner wall of the chamber 11, which is at comparatively low temperature, and consequently, it cannot be avoided that this SiO is subsequently exfoliated and becomes mixed in the melt as foreign matter. However, the purge gas guide path of the present embodiment partitions the space within the chamber 11 into the outer space and inner space, thereby preventing the evaporated materials from directly diffusing to the inner wall of the chamber 11 to be condensed on and adhered thereto. Particularly, by virtue of the formation of the purging tube 17, mixing of such foreign matter into the melt can be avoided. On the other hand, the thermal radiation shield 16 can prevent the foreign matters generated on the inner wall side of the chamber 11 from being mixed into the silicon melt 1. Further, the thermal radiation shield 16 can guide the purge gas to the lower space of the chamber 11, thereby enhancing the flow straightening property of the purge gas. Consequently, evaporated materials evaporated from the melt surface are efficiently entrained in the purge gas and can be discharged outside the chamber 11 with deposition thereof on peripheral components suppressed.

Next, a manufacturing method of the silicon single crystal using the silicon single crystal pull-up apparatus 10 will be described in detail.

Figure 5:
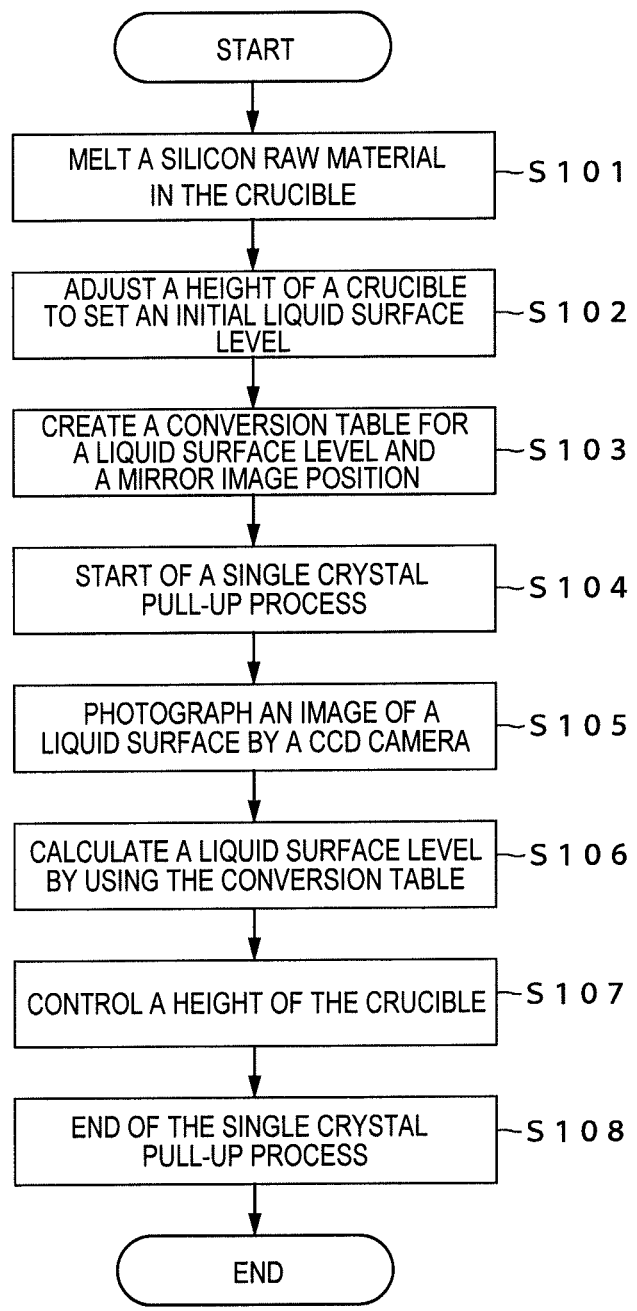
FIG. 5 is a flowchart illustrating a silicon single crystal manufacturing method according to the first embodiment.

FIG. 5 is a flowchart illustrating a silicon single crystal manufacturing method according to the first embodiment.

As shown in FIG. 5, in the manufacturing process of the silicon single crystal according to the first embodiment, an appropriate amount of polycrystalline silicon nuggets are packed into the crucible 12. Then, after the inside of the chamber 11 is set under an Ar gas atmosphere at a reduced pressure, the crucible is heated by the heater 15 to melt the silicon raw material in the crucible (S101). At this time, the seed crystal provided at the distal end of the wire 24 is located to be sufficiently higher than the quartz crucible and is spaced apart from the polysilicon which is being melted.

Next, after temperature control of the silicon melt 1 is performed until the silicon melt 1 is stabilized, the height of the crucible 12 is adjusted to set an initial liquid surface level $h_0$ of the silicon melt (S102). Although not especially limited, the setting of the initial liquid surface level $h_0$ can be achieved by an operator lifting and lowering the crucible while observing the liquid surface of the silicon melt.

Then, the height of the crucible 12 is further changed so as to create the conversion table representing a relationship between a current liquid surface level h1 with respect to the initial liquid surface level and the mirror image position of the thermal radiation shield 16 reflected on the liquid surface of the silicon melt 1 in the crucible 12 that can be seen through the purging tube 17 (S103). Specifically, for creating the conversion table, the liquid surface is photographed by the CCD camera 18 while lowering the crucible at a constant speed, and the position of the mirror image of the radiation heat shield 16 shown in the image photographed by the CCD camera 18 is calculated. However, in this case, a precise value of $h_0$ is unclear.

Figures 6A, 6B:
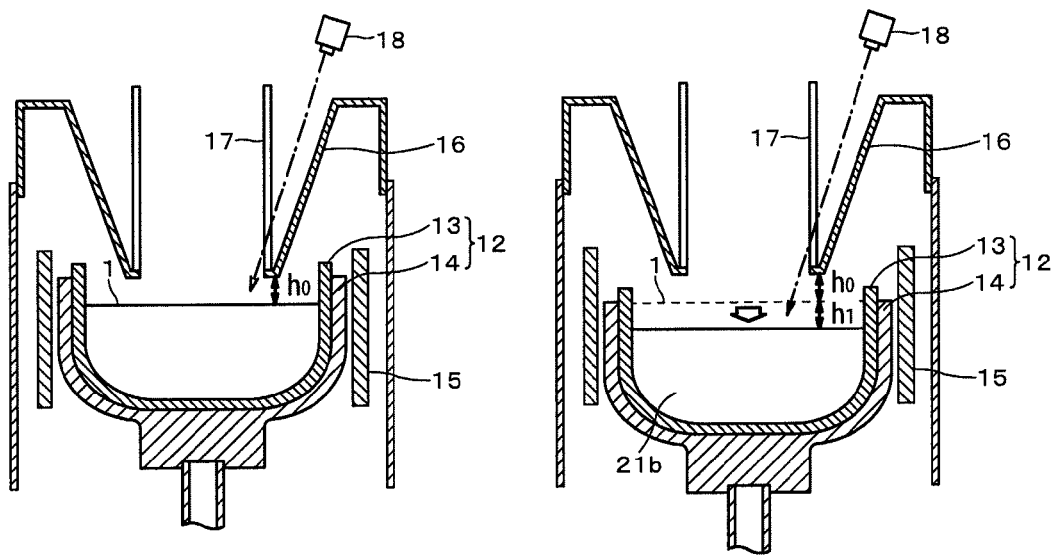
FIG. 6A is a cross-sectional view schematically illustrating a state where the height-direction position of a crucible is changed before the start of the single crystal pull-up process and a state where the crucible is in the initial position.
FIG. 6B is a cross-sectional view schematically illustrating a state where the height-direction position of the crucible is changed before the start of the single crystal pull-up process and a state where the crucible has been lowered.

FIGS. 6A and 6B are cross-sectional views schematically illustrating a state where the height-direction position of the crucible is changed before the start of the single crystal pull-up process. FIG. 6A illustrates a state where the crucible is in the initial position, and FIG. 6B illustrates a state where the crucible has been lowered.

In the creation of the conversion table, the crucible 12 is lowered from the initial position illustrated in FIG. 6A to the lowering position illustrated in FIG. 6B at, e.g., a speed of 1 mm/min to change the distance between the lower end of the thermal radiation shield 16 and the liquid surface from $h_0$ to $h_0+h_1$. The lowering amount of the crucible 12 at this time is $h_1$. The liquid surface of the silicon melt 1 is photographed in a six-second pitch along with the movement of the position of the crucible. As a result, the conversion table corresponding to a 0.1 mm pitch change in the liquid surface level can be created.

In the case where the two-dimensional CCD camera 18 is used, the mirror image of the thermal radiation shield 16 two-dimensionally appears in the photographed image, so that a plurality of different measurement points can be sampled. A change in the liquid surface level at each measurement point can be calculated from the number of pixels between the previous and current positions of each measurement point, and the final liquid surface level can be obtained from the average value of the respective liquid surface levels. By calculating the liquid surface level based on the plurality of measurement points as described above, it is possible to prevent generation of a variation due to the distortion of the purging tube 17 or fluctuation of the surface of the silicon melt 1.

Then, the pull-up process of the silicon single crystal is started (S104). In the pull-up process of the silicon single crystal using the CZ method, the silicon single crystal is grown at the lower end of the seed crystal by slowly pulling up the seed crystal while rotating the shaft 21 and the wire 24 in the opposite directions to each other.

In the growth of the silicon single crystal, in order to obtain a dislocation-free single crystal, a seed crystal diameter narrowing (necking) by the Dash method is performed. Next, in order to obtain a silicon single crystal with a desired diameter, a shoulder section is grown. When the desired diameter of the silicon single crystal is reached, a body section with a constant diameter is grown. After the body section is grown up to a predetermined length, a tail section diameter narrowing (forming of a tail section) is performed in order to cut the dislocation-free single crystal from the silicon melt 1.

In the necking, in order to eliminate a dislocation originally included in the seed crystal, or a slip dislocation generated in the seed crystal due to a thermal impact at the time of the contact at the silicon melt, the neck section is formed to have a minimum diameter of 3 mm to 5 mm by slowly pulling up the seed crystal while relatively rotating the seed crystal. When the length of the neck section reaches 10 mm to 20 mm and thus the slip dislocation is completely removed, the pull-up speed of the seed crystal and the temperature of the silicon melt 1 are controlled to increase the diameter of the neck section, thus performing the growth of the shoulder section.

When the diameter of the shoulder section reaches a desired diameter, the growth of the body section is performed. To increase wafer yield, it is required to maintain the diameter of the body section constant, and during the growth of the single crystal, output of the heater 15, pull-up speed, elevation speed of the crucible 12 and the like are controlled so that the body section can maintain a substantially constant diameter. In particular, as the growth of the silicon single crystal is followed by a decrease of the silicon melt 1, resulting in a lowering of the liquid surface level of the silicon melt 1, the crucible 12 is raised in accordance with the lowering of the liquid surface level.

In order to control the liquid surface level, the image of the liquid surface is photographed by the CCD camera 18, and the liquid surface level is calculated based on the mirror image of the thermal radiation shield 16 (S105, S106). As described above, the image of the melt surface seen through the cylindrical purging tube 17 is distorted, so that a use of the conversion formula based on the straight-line approximation results in calculation of the liquid surface level including large error. However, in the present embodiment, the liquid surface level is calculated using the conversion table representing a one-to-one correspondence between the mirror image position and liquid surface level, and the elevation speed of the crucible is controlled based on the calculated liquid surface level (S107), thereby allowing precise control. The controller 30 controls the shaft drive mechanism 22 based on the liquid surface level calculated by the liquid surface level calculator 31 to control the height of the crucible 12, thereby controlling the liquid surface level.

The thermal radiation shield 16 functions also as a gas straightening member that straightens the flow of the purge gas near the surface of the silicon melt 1. By appropriately controlling the position (elevation speed) of the crucible 12 in accordance with the pull-up of the silicon single crystal, it is possible to control the distance between the lower end of the thermal radiation shield 16 and the melt surface, thereby controlling the flow speed of the purge gas flowing near the surface of the silicon melt (purge gas guide path). As a result, the evaporation amount of the dopant from the silicon melt can be controlled to thereby improve the stability in the resistivity distribution of the silicon single crystal in the pull-up direction.

After the body section is grown up to a predetermined length, forming of the tail section is performed. In order to prevent quality problems such as slip dislocation or abnormal oxygen precipitation from being generated when a thermal balance between the silicon melt 1 and the silicon single crystal 2 existing at a crystal growth interface is broken and an abrupt thermal impact is applied to the crystal, a conical tail section is formed by slowly reducing the diameter of the silicon single crystal, and then the silicon single crystal is separated from the silicon melt 1, whereby the single crystal pull-up process is completed (S108). Thereafter, a silicon single crystal ingot separated from the silicon melt 1 is cooled under a predetermined condition, and silicon wafers cut from the silicon single crystal ingot are used as a substrate material for a variety of semiconductor devices.

As described above, according to the present embodiment, precise control of the liquid surface level of the silicon melt can be achieved in the silicon single crystal pull-up process performed based on the CZ method and using the purging tube, thereby appropriately controlling the amount of the dopant entrained in the silicon single crystal ingot.

Next, a silicon single crystal manufacturing method according to a second embodiment will be described. The second embodiment is featured by using conversion tables created based on a state where the purging tube 17 is provided and state where the purging tube 17 is not provided. Thus, the purging tube 17 according to the present embodiment is configured to be able to be raised and lowered.

Figure 7:
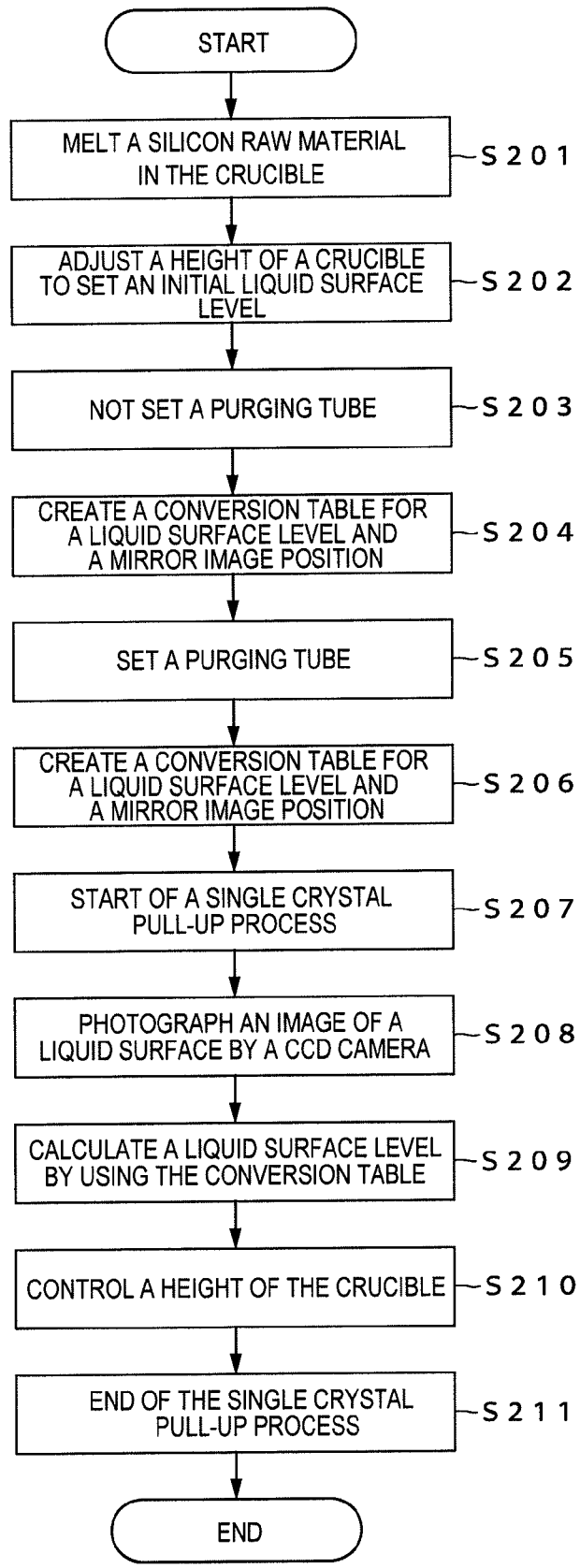
FIG. 7 is a flowchart illustrating a silicon single crystal manufacturing method according to the second embodiment.
Figure 8A:
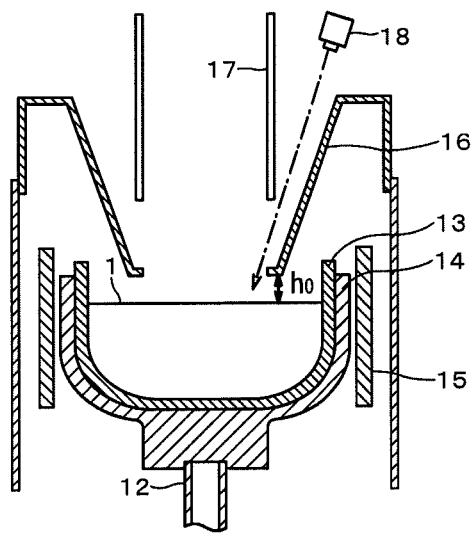
FIG. 8A is a cross-sectional view each schematically illustrating a state of the purging tube and a state where the purging tube has been pulled up.
Figure 8B:
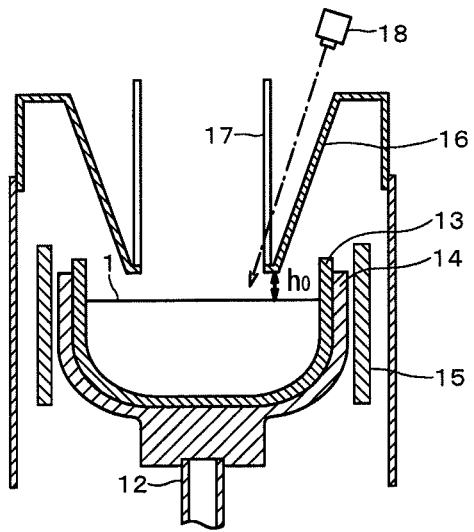
FIG. 8B is a cross-sectional view each schematically illustrating a state of the purging tube and a state where the purging tube is in a normal position.

FIG. 7 is a flowchart illustrating a silicon single crystal manufacturing method according to the second embodiment. FIGS. 8A and 8B are cross-sectional views each schematically illustrating a state of the purging tube 17. FIG. 8A illustrates a state where the purging tube 17 has been pulled up, and FIG. 8B illustrates a state where the purging tube 17 is in a normal position.

As shown in FIG. 7, in the manufacturing process of the silicon single crystal according to the second embodiment, the polycrystalline silicon nuggets in the crucible 12 are heated by the heater 15 to be melted (S201), as in the first embodiment.

Next, after temperature control of the silicon melt 1 is performed until the silicon melt 1 is stabilized, the height of the crucible 12 is adjusted to set an initial liquid surface level $h_0$ of the silicon melt (S202). Although not especially limited, the setting of the initial liquid surface level $h_0$ can be achieved by an operator raising and lowering the crucible while observing the liquid surface of the silicon melt.

Then, the purging tube 17 is lifted up as illustrated in FIG. 8A. In such a state where the purging tube 17 is not provided, the conversion table representing a relationship between a relative surface level by reference to the initial liquid surface level $h_0$ and the mirror image position of the thermal radiation shield 16 reflected on the liquid surface of the silicon melt 1 in the crucible 12 is created while raising and lowering the crucible 12 and changing the height of the liquid surface level (S203, S204). Next, the purging tube 17 is lowered as illustrated in FIG. 8B. In such a state where the purging tube 17 is provided, the conversion table representing a relationship between a relative surface level by reference to the initial liquid surface level $h_0$ and the mirror image position of the thermal radiation shield 16 reflected on the liquid surface of the silicon melt 1 in the crucible 12 that can be seen through the purging tube 17 is created by the same operation in the state where the purging tube 17 is not provided (S205, S206). Specifically, for creating the conversion table, the liquid surface is photographed by the CCD camera 18, and the position of the mirror image of the radiation heat shield 16 reflected on the melt surface is identified from the image photographed by the CCD camera 18. Then, the relationship between the mirror image position and liquid surface level is recorded.

Then, the pull-up process of the silicon single crystal is started (S207). During the pull-up process of the silicon single crystal, in order to control the liquid surface level, the image of the liquid surface is photographed using the CCD camera 18, and the liquid surface level is calculated based on the position of the mirror image of the thermal radiation shield 16 (S208, S209). As described above, the image of the melt surface seen through the cylindrical purging tube 17 is distorted, so that a use of the conversion formula based on the straight-line approximation results in calculation of the liquid surface level including large error. However, in the present embodiment, the liquid surface level is calculated using the conversion table representing a one-to-one correspondence between the mirror image position and liquid surface level, and the elevation speed of the crucible is controlled based on the calculated liquid surface level (S210), thereby allowing precise control. During the pull-up process of the single crystal, the neck section, shoulder section, and body section are sequentially formed. When the body section is grownup to a predetermined length, the conical tail section is formed, and then the silicon single crystal is separated from the silicon melt 1, whereby the single crystal pull-up process is completed (S211).

As described above, according to the present embodiment, influence of the purging tube 17 can precisely be grasped in addition to the effect obtained in the first embodiment.

Although the present invention has been described based on the preferred embodiments, the present invention is not limited to the above embodiments and various modifications may be made within the scope of the present invention. Accordingly, all such modifications are included in the present invention.

For example, although the purging tube 17 is made of quartz glass in the above embodiments, the material of the purging tube 17 is not limited to the quartz glass but any material, such as graphite with little variation of thermal history, may be used. For example, in the case where the purging tube 17 is constituted by a plurality of cylindrical members connected to each other, it is possible to use graphite and quartz glass as the upper cylindrical member and lower cylindrical member provided on the optical axis of the CCD camera, respectively. Further, although the flat surface 17a of the purging tube 17 illustrated in FIG. 2 is provided at one location, a plurality thereof may be provided.

Further, although the CCD camera is used as a means for photographing the liquid surface of the silicon melt, various types of photographing means that can capture the mirror image of the thermal radiation shield 16 reflected on the liquid surface of the silicon melt may be used.

What is claimed is:

1. A silicon single crystal pull-up apparatus comprising:
a chamber into which an inert gas is introduced;
a crucible that supports a silicon melt within the chamber;
a heater that heats the silicon melt in the crucible;
a lifting device for lifting and lowering the crucible;
a thermal radiation shield disposed above the crucible;
a purging tube that has substantially cylindrical shape and is provided inside the thermal radiation shield so as to straighten the inert gas;
a camera that photographs a mirror image of the thermal radiation shield reflected on the liquid surface of the silicon melt through the purging tube;
a liquid surface level calculator that calculates a liquid surface level of the silicon melt from the position of the mirror image photographed by the camera; and
a conversion table creator that creates a conversion table representing a relationship between the liquid surface level of the silicon melt and the mirror image position obtained when the crucible is lifted and lowered before start of a single crystal pull-up process to arbitrarily change the liquid surface level of the silicon melt, wherein
the liquid surface level calculator calculates the liquid surface level based on the position of the mirror image photographed by the camera and the conversion table.

2. The silicon single crystal pull-up apparatus as claimed in claim 1, wherein
the liquid surface level calculator calculates the liquid surface level of the silicon melt from a plurality of measurement points in the mirror image photographed by the camera, and
the conversion table creator creates the conversion table based on the plurality of the measurement points.

3. The silicon single crystal pull-up apparatus as claimed in claim 1, wherein the purging tube has a flat surface formed at an area including the intersection with an optical axis of the camera.

4. The silicon single crystal pull-up apparatus as claimed in claim 1 further comprising a controller for controlling the lifting device based on the liquid surface level calculated by the liquid surface level calculator to control the height of the crucible so as to control the liquid surface level with respect to the thermal radiation shield.

5. The silicon single crystal pull-up apparatus as claimed in claim 1, wherein
the camera photographs the mirror image in a state where the purging tube does not exist on the optical axis, and
the conversion table creator creates the conversion table representing a relationship between the liquid surface level obtained when the liquid surface level of the silicon melt is arbitrarily changed while lifting and lowering the crucible before start of a single crystal pull-up process and the position of the mirror image in the state where the purging tube does not exist.

6. A method of manufacturing a silicon single crystal comprising:
creating a conversion table representing a relationship between a position of a mirror image of a thermal radiation shield reflected on a liquid surface of a silicon melt and liquid surface level from the obtained images before a start of a single crystal pull-up process; and
photographing the mirror image of the thermal radiation shield reflected on the silicon melt through a purging tube, calculating a liquid surface level from a position of the mirror image using the conversion table, and controlling the height of a crucible based on the calculated liquid surface level during the single crystal pull-up process.

7. The method of manufacturing a silicon single crystal as claimed in claim 6, wherein
the liquid surface level of the silicon melt is calculated from a plurality of measurement points in the mirror image, and
the conversion table is created based on the plurality of the measurement points.

8. The method of manufacturing a silicon single crystal as claimed in claim 6, wherein
the purging tube has a flat surface formed at an area including the intersection with an optical axis of the camera that photographs the image.

* * * * *